United States Patent
Krishnan et al.

(10) Patent No.: US 6,535,015 B1
(45) Date of Patent: Mar. 18, 2003

(54) DEVICE AND METHOD FOR TESTING PERFORMANCE OF SILICON STRUCTURES

(75) Inventors: Srinath Krishnan, Campbell, CA (US); Dong-Hyuk Ju, Cupertino, CA (US); William G. En, Milpitas, CA (US); Siu Lun Lee, Sunnyvale, CA (US); Richard K. Klein, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 45 days.

(21) Appl. No.: 09/845,266

(22) Filed: Apr. 30, 2001

(51) Int. Cl.[7] .............................................. G01R 31/02
(52) U.S. Cl. ..................... 324/769; 324/158.1; 324/765
(58) Field of Search ................. 324/769, 763, 324/158.1, 765, 678; 327/291, 156, 158, 233, 292, 293; 326/81; 716/8

(56) References Cited

U.S. PATENT DOCUMENTS

| | | | | |
|---|---|---|---|---|
| 6,080,205 A | * | 6/2000 | Oshikawa | ...................... 716/8 |
| 6,181,174 B1 | * | 1/2002 | Fujieda et al. | .............. 327/158 |
| 6,404,232 B1 | * | 6/2002 | Mizuno et al. | ............. 327/534 |
| 6,424,576 B1 | * | 6/2002 | Antosh et al. | ......... 365/189.05 |
| 6,414,498 B2 | * | 7/2002 | Chen | .......................... 324/678 |

* cited by examiner

Primary Examiner—Kamand Cuneo
Assistant Examiner—Jimmy Nguyen
(74) Attorney, Agent, or Firm—Renner, Otto, Boisselle & Sklar

(57) ABSTRACT

An integrated test circuit for a silicon on insulator circuit structure is formed on the same wafer as the circuit structure. The wafer includes an input circuit coupled to the silicon on insulator circuit structure which generates a drive signal for operating the silicon on insulator circuit structure and an output circuit which processes a response signal from the circuit structure to generate an output signal representing certain characteristics of the silicon on insulator circuit structure.

16 Claims, 2 Drawing Sheets

DEVICE AND METHOD FOR TESTING PERFORMANCE OF SILICON STRUCTURES

TECHNICAL FIELD

The present invention relates generally devices and methods for testing the performance of silicon structures, and more specifically to an integrated circuit for testing the floating body effect of silicon on insulator integrated circuit structures.

BACKGROUND OF THE INVENTION

Silicon on Insulator (SOI) technology refers to integrated circuit technology for forming field effect transistors (FETs), and other SOI structures, in a thin layer of silicon positioned above a layer of insulating material.

Utilizing SOI technology, an SOI wafer is formed from a bulk silicon wafer by using conventional oxygen implantation techniques or wafer bonding techniques to create a buried silicon dioxide insulating layer at a predetermined depth below the surface of the wafer. Between the insulating layer and the surface is a thin layer of silicon wherein SOI structures are fabricated and isolated from other SOI devices formed therein utilizing SOI fabrication processes.

The advantages of SOI circuits over conventional bulk semiconductor circuits include: i) reduced size because electrical isolation of each SOI FET utilizes less surface area than required utilizing bulk technology; ii) reduced power consumption because junction capacitance between the source/drain and off state leakage from the drain to the source are both less for an SOI FET than a bulk FET; and iii) increased operating speed because the reduced junction capacitance increases the speed at which a device can operate.

However, a problem associated with SOI FETs is known as the floating body effect. The floating body effect occurs because the buried oxide layer isolates the channel, or body, of the FET from the fixed potential silicon substrate. Therefore the body takes on charge based on historical operation of the transistor. The floating body effect causes the current-to-voltage curve for the transistor to distort or kink, which in turn causes the threshold voltage for operating the transistor to fluctuate. This problem is particularly apparent for pass gate devices such as those used in dynamic random access memory (DRAM) wherein it is critical that the threshold voltage remain fixed such that the transistor remains in the "Off" position to prevent charge leakage from the storage capacitor.

Accordingly, it is desirable for the FET to have a structure which minimizes the floating body effect, or at the least, optimizes a trade off of performance characteristics, including the floating body effect, based on the circuits desired operating characteristics. Because the SOI FET structure is determined by the SOI fabrication process parameters, adjusting the process parameters will alter the FET structure and performance. Typically, performance parameters are optimized using an empirical and iterative process wherein i) test structures are made utilizing trial fabrication parameters, ii) performance of the test device are measured, and iii) fabrication parameters are adjusted for fabrication of the next test device.

Typically the testing is performed by coupling the test SOI structures to I/O leads. Test signals are generated on a remote signal generation device and coupled to the I/O leads for driving the test SOI structures. The response signals are coupled to remote measurement circuits (again via the I/O leads) for measuring the response of the test structures to the test signals.

A problem associated with such testing systems is that the measurement accuracy is distorted by 1) signal degradation of the test signals caused by noise on wires or traces. which couple the test signals to the test SOI structures; 2) signal degradation of the response signals caused by noise on the wires or traces which coupled the response signals from the test SOI structures to the remote measurement circuits; and 3) signal degradation of both the test signals and response signals caused by I/O circuits which are required for appropriately isolating, ESD protecting, and coupling SOI structures to "off chip" circuits.

Accordingly, there is a strong need in the art for a device and method for testing performance of trial silicon on insulator structures that does not suffer the disadvantages of known systems.

SUMMARY OF THE INVENTION

A first object of this invention is to provide a single wafer test circuit for testing performance of a silicon on insulator circuit structure. The circuit is fabricated on the wafer and includes a circuit structure or, device under test (DUT), on which performance testing is to be performed. In addition an input circuit is fabricated on the wafer, and coupled to the DUT, for generating a drive signal for operating the DUT. An output circuit structure is also fabricated on the wafer, and coupled to the DUT, for generating an output signal representative of the response of the DUT to the drive signal. Metal layer circuits formed on the wafer above the DUT couple the DUT to each of the input circuit structure and the output circuit structure.

The input circuit may include a clock circuit generating. a plurality of clock signals, each at a different clock frequency, and a select circuit for selecting a combination of one or more of the plurality of clock signals to generate the drive signal at a desired frequency and duty cycle. An oscillator may generate a high frequency clock signal and a plurality of counters may each generate one of the plurality of clock signals at a fractional frequency of the high frequency clock signal.

Further, the input circuit may include a load circuit with a plurality of capacitive loads, each of a different capacitance, and a load select circuit for selecting one of the plurality of capacitive loads for coupling to the selected one of the clock signals for generating the drive signal.

A wafer input circuit may couple each of power and ground to the wafer and may also provide appropriate isolation for coupling each of the clock select signal to the clock select circuit and a load select signal to the load select circuit.

The output circuit may include an integrator generating a voltage signal in accordance with a current characteristic of the response signal. A wafer output circuit may provide appropriate isolation and amplification for coupling the output signal to an off chip measurement and evaluation device.

The DUT may be a silicon on insulator field effect transistor and the output signal may represent at least one of rise and fall time of the FET in response to the drive signal coupled to a gate of the FET. Alternatively, the output signal may represent current through the FET in response to a voltage of the drive circuit applied to a gate of the FET.

A second aspect of the present invention is to provide a method of testing performance of a DUT. The method comprises driving the DUT with a drive signal generated on the silicon on insulator wafer and processing a response signal from the DUT on the silicon on insulator wafer to generate an output signal representing the response signal.

The step of driving the DUT with a drive signal generated on the silicon on insulator wafer includes generating a plurality of clock signals, each at a different clock frequency, and selecting a combination of one or more of the plurality of clock signals to generate the drive signal at a desired frequency and duty cycle. More specifically, the step may include generating a single clock signal of a first frequency and generating the plurality of clock signals, each at a different fractional frequency of the first frequency. A remote clock select signal may be coupled to the wafer for selecting one of the plurality of clock signals.

The step of driving the DUT may also include coupling the selected one of the plurality of clock signals to a selected one of a plurality of capacitive loads. A remote load select signal may be coupled to the wafer for selecting of the plurality of capacitive loads.

The step of processing a response signal from the silicon on insulator circuit structure on the silicon on insulator wafer to generate an output signal representing the response signal includes integrating a current characteristic of the response signal to generate a voltage signal. The voltage signal may be measured by a remote measurement circuit coupled to the silicon on insulator wafer.

Again, the DUT may be a silicon on insulator field effect transistor and the output signal may represent at least one of rise and fall time of the FET in response to the drive signal coupled to a gate of the FET. Alternatively, the output signal may represent current through the FET in response to a voltage of the drive circuit applied to a gate of the FET.

DESCRIPTION OF THE PREFERRED EMBODIMENTS

Figure 1:
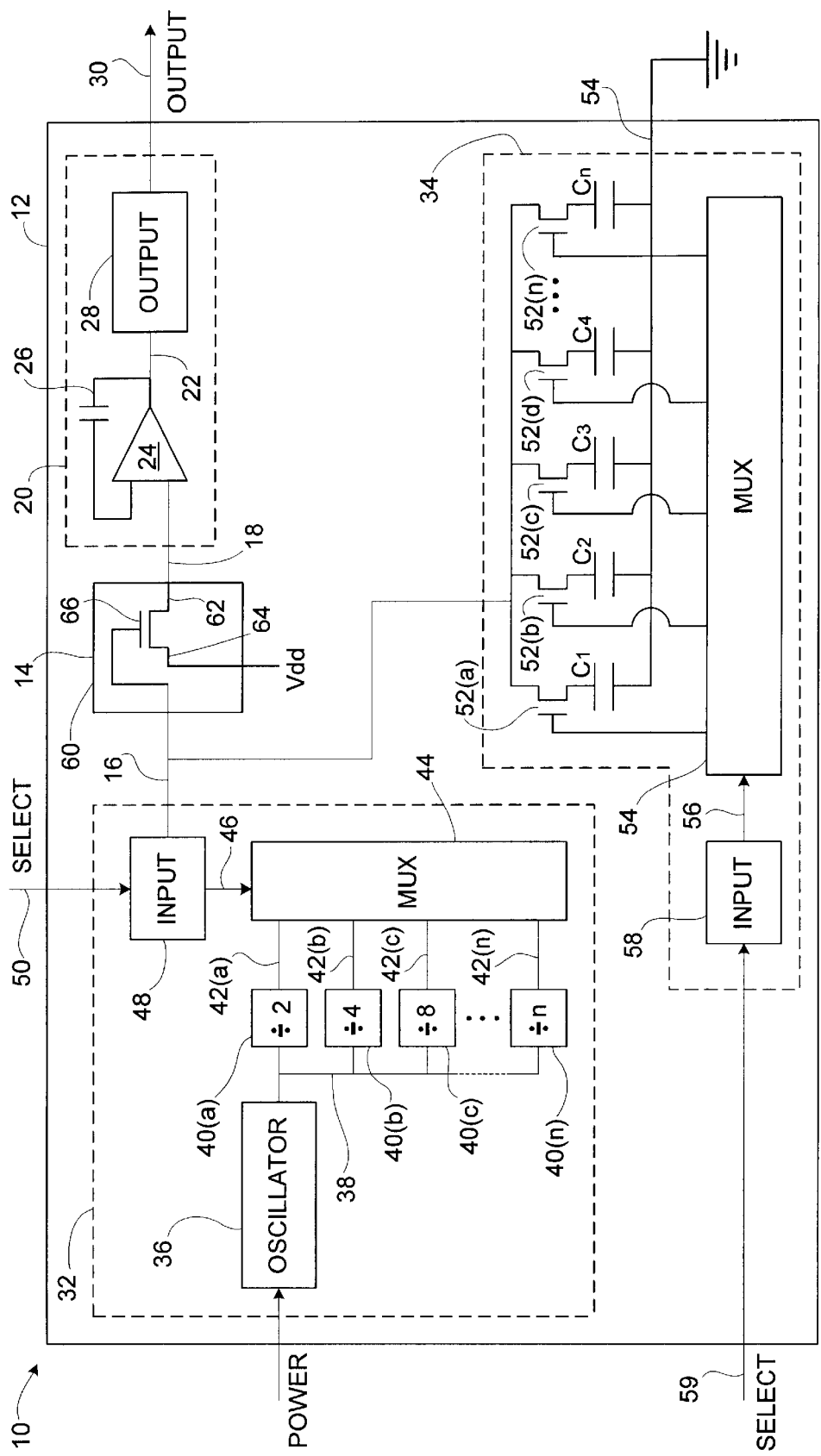
FIG. 1 is a block diagram of a silicon on insulator test wafer in accordance with one embodiment of this invention.

The present invention will now be described in detail with reference to the drawings. In the drawings, like reference numerals are used to refer to like elements throughout.

Referring to FIG. 1, a single wafer test circuit 10 for testing performance of a silicon on insulator circuit structure is shown. The test circuit 10 includes a silicon on insulator circuit structure or device under test (DUT) 14 formed on a silicon on insulator wafer 12. The DUT 14 may be a silicon on insulator field effect transistor 60 or it may be a circuit structure comprising a plurality of FETs and other silicon on insulator structures formed on the wafer 12. For purposes of illustration, DUT 14 is shown as a single FET 60 which includes a source 62, drain 64, and gate 66. The gate 66 is coupled to a drive signal on line 16, the drain 64 is coupled to the $V_{dd}$ potential, and the source 62 provides a response signal on line 18.

Figure 2:
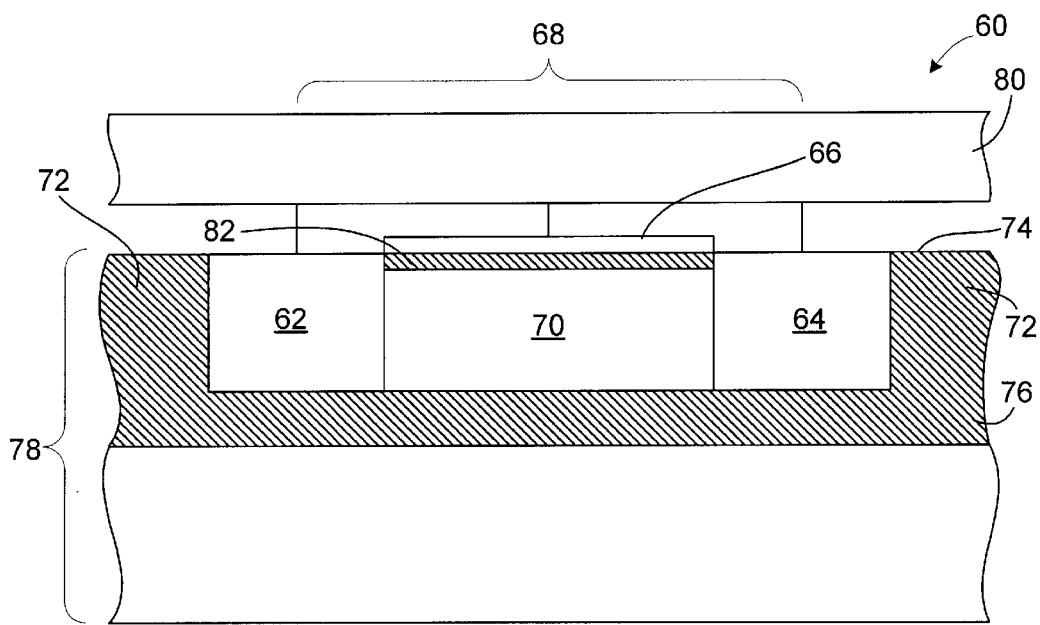
FIG. 2 is a cross section diagram showing the structure of a silicon on insulator field effect transistor (FET) useful in the practice of one embodiment of this invention.

Briefly referring to FIG. 2, it can be seen that an active region 68 of the FET 60 includes a channel region 70 spaced between the source region 62 and the drain region 64. Together the channel region 70, source region 62, and drain region 64 comprise an active region 68 of the FET 60. The active region 68 is isolated from other structures formed in the silicon substrate 78 by an insulating trench 72. The insulating trench 72 which extends from the surface 74 of the silicon substrate 78 to a buried oxide layer 76 and extends about the perimeter of the active region 68. The buried oxide layer 76 forms the bottom surface of the active region 68. The gate 66 is positioned above the channel region 70 and is separated from the channel region 70 by a thin layer of insulating gate oxide 82. The source region 62 and the drain region 64 are doped to a first conductivity silicon and the channel region 70 is doped to the opposite conductivity. Above the gate 66, and above the active region 68, are metal layers 80 which include conductive circuits for interconnecting each of the source region 62, drain region 64, gate 66, and other circuit devices for operating the FET 60.

In operation, an operating potential is applied to the gate 66 which causes a charge accumulation (or depletion) in the channel region 70. The charge accumulation or depletion in the channel region 70 effects conductivity of current between the drain region 64 and the source region 62. It should be appreciated that because the channel region 70 is isolated from the ground potential the charge accumulation and depletion in the channel region 70 is also effected by historical operation of the FET 60 which is what is known as the floating body effect. The floating body effect may cause an undesirable kink in the FET's I/V characteristics (e.g. current through the FET 60 in response to voltage applied to the gate 66) and may cause undesirable rise and fall times associated with operation of the FET 60.

Referring again to FIG. 1, the response signal on line 18 is coupled to an output circuit 20, which is also fabricated on the wafer 12. The output circuit 20 generates an output voltage signal on line 30 which is representative of the response signal on line 18. More specifically, the output circuit 20 includes an integrator comprising an operational amplifier 24 and a capacitor 26 for integrating the response signal current on line 18 and generating an output voltage signal on line 22 representative of the pulse shape of the response signal in response to the drive signal on line 16. The output voltage signal on line 22 is coupled to an output interface circuit 28 which includes the necessary amplification and isolation circuits to drive the output voltage signal on line 30 off chip to a remote measuring system (not shown).

The drive signal on line 16 is formed by a combination of a clock circuit 32 and a load circuit 34, both fabricated on the wafer 12. The clock circuit 32 includes an oscillator 36 generating a high frequency clock signal on high frequency clock bus 38. The high frequency clock signal on bus 38 is input to a plurality of counters 40(a)–40(n). Each of counters 40(a)–40(n) functions as a frequency divider by providing a clock transition every "X" cycles of the high frequency clock signal. Because the value of "X" is different for each of the plurality of counters 40(a)–40(n), each of the plurality of counters 40(a)–40(n) outputs a unique frequency signal frequency lines 42(a)–42(n) respectively. For purposes of illustration, counter 40(a) is a "divide by 2" counter which indicates that it will generate a clock transition every two clock signals of the high frequency clock signal for a frequency that is one half the frequency of the high frequency clock signal. Similarly, counter 40(b) is a "divide by 4" counter which indicates that it will generate a clock transition every four clock signals of the high frequency clock signal for a frequency that is one fourth the frequency of the high frequency clock signal. This invention envisions that there will be on the order of twenty counters, each generating a unique frequency on its corresponding frequency line 42.

It should be appreciated that because each counter 40(a)–40(n) generates a clock transition every "X" cycles of the high frequency clock signal on its respective frequency line 42(a)–42(n), the signals on each frequency line 42(a)–42(n) may be multiplexed in various combinations to provide a plurality of signals at various frequencies and various duty cycles.

As such, each frequency line 42(a)–42(n) is coupled to a multiplexer which selects a combination of the frequency lines 42 to couple to line 16 to generate the drive signal in accordance with a select signal on line 46. The select signal on line 46 is generated by an input interface circuit 48 in accordance with an off chip frequency and duty cycle select signal on line 50. The input interface circuit 48 includes the necessary isolation circuits for coupling the off chip frequency and duty cycle select signal to the multiplexer 44.

The load circuit 34, which is also coupled to line 16, generates a desired load on the drive signal. The load circuit includes a plurality of FETs 52(a)–52(n), each of which operates as a switch that, when closed, increases the capacitive loading on the drive signal on line 16. Each of the capacitive loads C(1)–C(n) is ted to ground via line 54.

Each of the plurality of FETs 52(a)–52(n) is coupled to a multiplexer 54 which selects a combination of one or more of the FETs 52(a)–52(n) to activate (e.g. close the switch) to couple the FETs associated capacitive load C(1)–C(n) to the drive signal on line 16.

The multiplexer 54 selects the combination of one or more FETs 52(a)–52(n) to activate in accordance with a load select signal on line 56. The load select signal on line 56 is generated by a load input interface circuit 58 in accordance with an off chip load input signal on line 59. The load input interface circuit 48 includes the necessary isolation circuits for coupling an off chip input signal to the multiplexer 44.

As such, it should be appreciated that by utilizing the multiplexer 44 to select a combination of the frequency signals on frequency signal lines 42(a)–42(n) to obtain a desired frequency and duty cycle pulse on drive signal line 16 and by utilizing the multiplexer 54 to select a desired combination of capacitive loads on the drive signal on line 16, a desired pulse shape (e.g. rise and fall characteristics) may be achieved on drive signal line 16.

Figure 3:
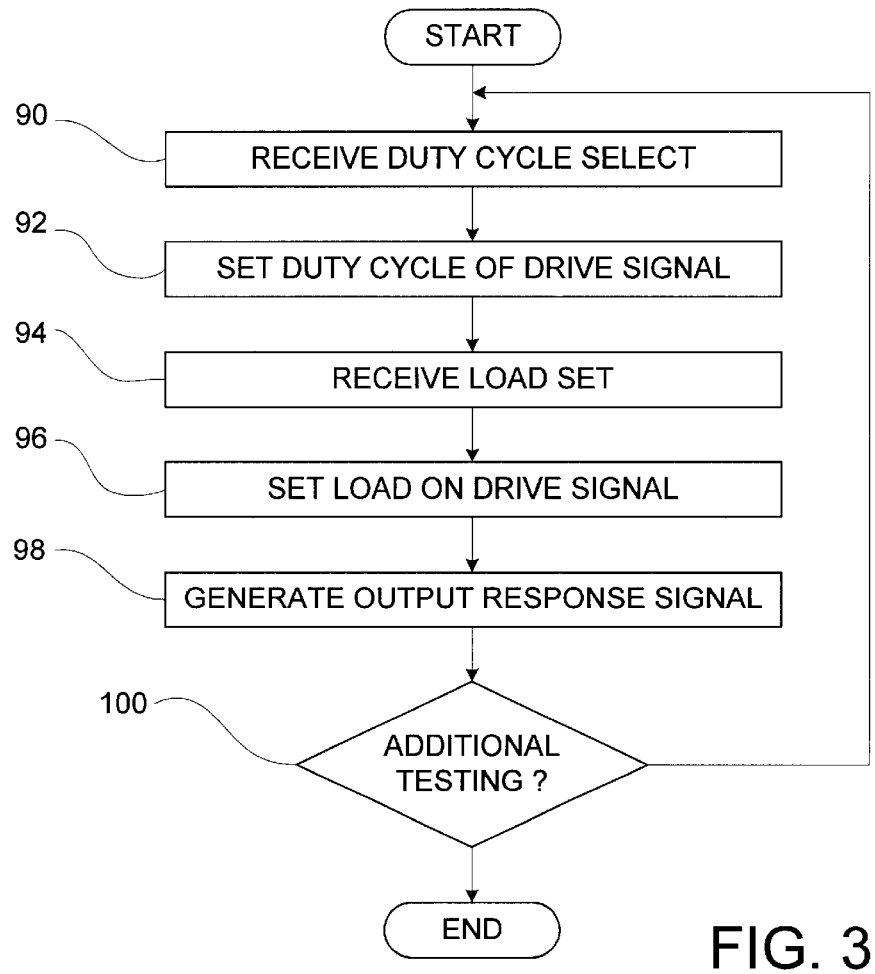
FIG. 3 is a flow chart showing a processes for testing a silicon on insulator circuit structure in accordance with one embodiment of this invention.

Referring to the flowchart of FIG. 3 in conjunction with the diagram of FIG. 1, operation of the single wafer test circuit 10 for testing performance of the DUT 14 is shown. It should be appreciated that because the different portions of the circuit 10, including the output circuit 20, clock circuit 32, and load circuit 34 are operating simultaneously, the steps represented by the flowchart of FIG. 3 can occur simultaneously.

Step 90 represents receiving the frequency and duty cycle select signal on line 50 from an external frequency and duty cycle selection source (not shown) and step 92 represents the multiplexer 44 generating the drive signal by coupling the appropriate combination of the frequency signals on lines 42(a)–42(n) to line 16.

Step 94 represents receiving a load select signal on line 59 from an external load selection source (not shown) and step 96 represents coupling the load selection multiplexer activating an appropriate combination of FETs 52(a)–52(n) to couple the appropriate combination of capacitive loads C(a)–C(n) line 16.

Step 98 represents generating the off chip output signal on line 30 for coupling to an external measurement and evaluation device (not shown) by processing the response signal from the DUT 14 on line 18 to generate the output signal on line 22 and generating the off chip output signal on line 30 form the output signal on line 22. It should be appreciated that the invention as shown and described provides for more accurate evaluation of a silicon on insulator circuit structures response to a drive signal of variable characteristics than existing systems. Although the invention has been shown and described with respect to certain preferred embodiments, it is obvious that equivalents and modifications will occur to others skilled in the art upon reading and understanding of the specification. The present invention includes all such equivalents and modifications, and is limited only by the scope of the following claims.

What is claimed is:

1. A single wafer test circuit for testing response of a silicon on insulator circuit structure to an input signal, the circuit comprising:

a) a silicon on insulator circuit structure formed on the wafer;

b) an input circuit formed on the wafer and coupled to the silicon on insulator circuit structure through metal layer circuits and generating a drive signal for operating the silicon on insulator circuit structure;

c) an output circuit formed on the wafer and coupled to the silicon on insulator circuit structure through metal layer circuits and generating an output signal representative of the response of the silicon on insulator circuit structure to the drive signal; and d) wherein the input circuit includes a clock circuit generating a plurality of clock signals, each at a different clock frequency, and a clock select circuit for selection of a combination of one or more of the plurality of clock signals to generate the drive signal with a desired frequency and duty cycle.

2. The single wafer test circuit of claim 1, wherein the clock circuit includes an oscillator generating a clock signal and a plurality of counters, each generating one of the plurality of clock signals.

3. The single wafer test circuit of claim 2, further including a wafer input circuit for coupling each of power, ground, the clock select signal, and the load select signal from remote circuitry and a wafer output circuit for coupling the output signal to remote circuitry.

4. The single wafer test circuit of claim 3, wherein the silicon on insulator test structure is a field effect transistor (FET) and the output signal represents at least one of rise and fall time of the FET in response to the drive signal coupled to a gate of the FET.

5. The single wafer test circuit of claim 3, wherein the silicon on insulator test structure is a field effect transistor (FET) and the output signal represents current through the FET in response to a voltage of the drive circuit applied to a gate of the FET.

6. A single wafer test circuit for testing performance of a silicon on insulator circuit structure, the circuit comprising:

a) a silicon on insulator circuit structure formed on the wafer;

b) an input circuit formed on the wafer and coupled to the silicon on insulator circuit structure through metal layer circuits and generating a drive signal for operating the silicon on insulator circuit structure; and c) an output circuit formed on the wafer and coupled to the silicon on insulator circuit structure through metal layer circuits and generating an output signal representative of the response of the silicon on insulator circuit structure to the drive signal;
d) wherein the input circuit includes:
a clock circuit generating a plurality of clock signals, each at a different clock frequency, and a clock select circuit for selection of a combination of one or more of the plurality of clock signals to generate the drive signal with a desired frequency and duty cycle; and
a load circuit with a plurality of capacitive loads, each of a different capacitance, and a load select circuit for selecting one of the plurality of capacitive loads for coupling to the selected one of the clock signals for generating the drive signal.

7. The single wafer test circuit of claim 6, wherein the output circuit includes an integrator generating a voltage signal in accordance with a current characteristic of the response signal.

8. A method of testing performance of a silicon on insulator wafer circuit structure, the method comprising:
a) driving a silicon on insulator circuit structure with a drive signal generated on the silicon on insulator wafer,
b) processing a response signal from the silicon on insulator circuit structure on the silicon on insulator wafer to generate an output signal representing the response signal; and
c) wherein the step of driving a silicon on insulator circuit structure with a drive signal generated on the silicon on insulator wafer includes generating a plurality of clock signals, each at a different clock frequency, and selecting a combination of one or more of the plurality of clock signals to generate the drive signal at a desired frequency and duty cycle.

9. The method of claim 8, wherein the step of generating a plurality of clock signals includes generating a single clock signal of a first frequency and generating the plurality of clock signals, each at a different fractional frequency of the first frequency.

10. A method of testing performance of a silicon on insulator wafer circuit structure, the method comprising:
a) driving a silicon on insulator circuit structure with a drive signal generated on the silicon on insulator wafer by generating a single clock signal of a first frequency, generating the plurality of clock signals, each at a different fractional frequency of the first frequency, and selecting a combination of one or more of the plurality of clock signals to generate the drive signal at a desired frequency and duty cycle; and
b) processing a response signal from the silicon on insulator circuit structure on the silicon on insulator wafer to generate an output signal representing the response signal,
c) wherein the step of driving a silicon on insulator circuit structure with a drive signal generated on the silicon on insulator wafer further includes coupling the selected one of the plurality of clock signals to a selected one of a plurality of capacitive loads.

11. The method of claim 10, wherein the step of processing a response signal from the silicon on insulator circuit structure on the silicon on insulator wafer to generate an output signal representing the response signal includes integrating a current characteristic of the response signal to generate a voltage signal.

12. The method of claim 11, further including coupling a remote clock select signal to the silicon on insulator wafer for selecting one of the plurality of clock signals to generate the drive signal the clock select signal.

13. The method of claim 12, further including coupling a remote load select signal to the silicon on insulator wafer for selecting the one of the plurality of capacitive loads to couple to the selected one of the plurality of clock signals.

14. The method of claim 13, further including measuring the voltage signal with a remote measurement circuit coupled to the silicon on insulator wafer.

15. The method of claim 13, wherein the silicon on insulator wafer circuit structure is a field effect transistor (FET) and the output signal represents at least one of rise and fall time of the FET in response to the drive signal coupled to a gate of the FET.

16. The method of claim 13, wherein the silicon on insulator wafer circuit structure is a field effect transistor (FET) and the output signal represents current through the FET in response to a voltage of the drive circuit applied to a gate of the FET.

* * * * *